(12) United States Patent
Ecker et al.

(10) Patent No.: US 7,679,414 B1
(45) Date of Patent: Mar. 16, 2010

(54) METHOD AND APPARATUS FOR TUNING DELAY

(75) Inventors: Reuven Ecker, Haifa (IL); Inbal Gal, Petach Tikva (IL)

(73) Assignee: Marvell Israel (MISL) Ltd., Yokneam (IL)

( * ) Notice: Subject to any disclaimer, the term of this patent is extended or adjusted under 35 U.S.C. 154(b) by 0 days.

(21) Appl. No.: 12/170,900

(22) Filed: Jul. 10, 2008

Related U.S. Application Data

(60) Provisional application No. 60/948,789, filed on Jul. 10, 2007.

(51) Int. Cl.
    *H03H 11/06* (2006.01)
(52) U.S. Cl. .................. 327/261; 327/263; 327/264; 326/85; 326/87
(58) Field of Classification Search .................. 327/170, 327/261, 263–264, 269–272, 276–278, 281, 327/284–285, 288; 326/26, 27, 83, 85, 87
    See application file for complete search history.

(56) References Cited

U.S. PATENT DOCUMENTS

| | | | | |
|---|---|---|---|---|
| 5,121,014 A | * | 6/1992 | Huang | 327/276 |
| 5,917,758 A | * | 6/1999 | Keeth | 365/189.05 |
| 6,975,135 B1 | * | 12/2005 | Bui | 326/29 |
| 2006/0284658 A1 | * | 12/2006 | Wright | 327/170 |

* cited by examiner

*Primary Examiner*—An T Luu

(57) ABSTRACT

Aspects of the disclosure provide a fine tunable digital delay circuit that can be applied in a high frequency digital circuit. Further, the digital delay circuit can utilize a level restoring technique to enable a wide tunable delay range. The delay circuit can include a delay element configured to receive an input signal at an input node and output a controlled signal having a controlled rise time and a controlled fall time at a controlled node, a first plurality of transistors configured to bias a supply node of the delay element to govern the controlled rise time of the controlled signal, and a second plurality of transistors configured to bias a ground node of the delay element to govern the controlled fall time of the controlled signal. The delay circuit can further include a restoring circuit configured to charge or discharge the controlled node.

30 Claims, 10 Drawing Sheets

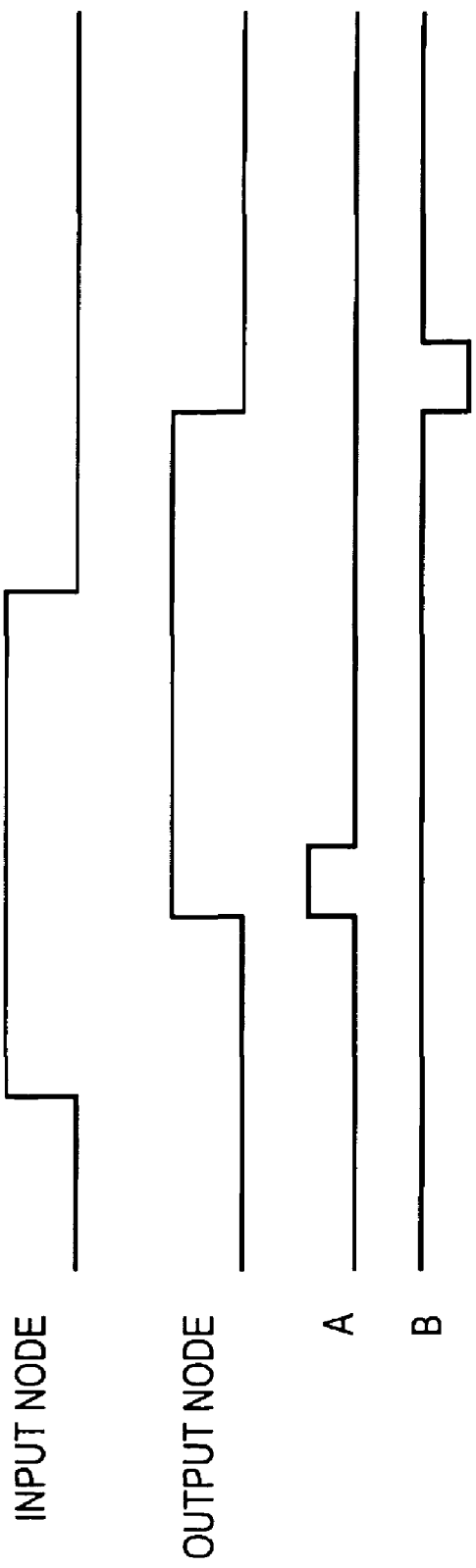

METHOD AND APPARATUS FOR TUNING DELAY

INCORPORATION BY REFERENCE

This application claims the benefit of U.S. Provisional Application No. 60/948,789, "LEVEL RESTORING SCHEME FOR A HIGH FREQUENCY, WIDE RANGE DELAY, FINE TUNE DIGITAL DELAY ELEMENT" filed on Jul. 10, 2007, which is incorporated herein by reference in its entirety.

BACKGROUND

A digital circuit can include a delay component that can adjust timings of the digital circuit to optimize circuit performances. For example, a digital circuit may include a plurality of internal clock signals that can be generated based directly or indirectly on a reference clock signal. The plurality of clock signals may have significant skews due to, for example, different propagation delays from the reference clock signal. A clock skew may adversely affect a circuit performance. To optimize the circuit performance, a delay component can be used to compensate for the clock skew. In another example, a circuit operation may require a specific timing sequence of multiple signals, such as clock signals, control signals, and the like. The specific timing sequence can be enabled by suitably applying delay components to the multiple signals.

SUMMARY

Aspects of the disclosure can provide a fine tunable digital delay circuit that can be applied in a high frequency digital circuit. Further, the digital delay circuit can utilize a level restoring technique to enable a wide tunable delay range.

The delay circuit can include a delay element configured to receive an input signal at an input node and output a controlled signal having a controlled rise time and a controlled fall time at a controlled node, a first plurality of transistors configured to bias a supply node of the delay element to govern the controlled rise time of the controlled signal, and a second plurality of transistors configured to bias a ground node of the delay element to govern the controlled fall time of the controlled signal.

According to an aspect of the disclosure, the first plurality of transistors can be p-type transistors. Similarly, the second plurality of transistors can be n-type transistors. Additionally, the first plurality of transistors can be configured to have a substantially same driving strength as the second plurality of transistors. Alternatively, the first plurality of transistors are configured to have a different driving strength from the second plurality of transistors. More specifically, a pull-up strength of the first plurality of transistors can be substantially same as a pull-down strength of the second plurality of transistors. Alternatively, a pull-up strength of the first plurality of transistors can be different from a pull-down strength of the second plurality of transistors.

Additionally, the delay circuit can further include a restoring circuit configured to charge or discharge the controlled node. Further, the delay circuit can include a delay path that is coupled between the input node and the restoring circuit, the delay path causing the restoring circuit to receive a delayed input signal. Alternatively, the delay circuit can include an output circuit that is coupled between the controlled node and an output node, the output circuit generating an output signal corresponding to the controlled signal, and a feedback path that is coupled between the output node and the restoring circuit.

According to another aspect of the disclosure, the delay circuit can further include a clock cycle delay circuit configured to provide a delay of an integer number of clock cycles.

According to an aspect of the disclosure, the delay element can include an inverter that can invert the controlled signal relative to the input signal. Additionally, the first plurality of transistors may include a configurable number of transistors to govern the controlled rises time of the controlled signal, and the second plurality of transistors can also include a configurable number of transistors to govern the controlled fall time of the controlled signal.

An alternatively delay circuit may include a delay configuration unit coupled between an input node and a controlled node, the delay configuration unit being configured to generate a controlled transition at the controlled node corresponding to an input transition at the input node by charging or discharging the controlled node to a transition level, and a restoring unit coupled to the controlled node, the restoring unit being configured to accelerate charging or discharging the controlled node after the controlled node reaches the transition level.

Aspects of the disclosure can also provide a method for delay generation. The method can include receiving an input signal having an input transition, generating a controlled transition having a configurable delay corresponding to the input transition at a controlled node by charging or discharging the controlled node, and restoring the controlled node to a full swing level.

BRIEF DESCRIPTION OF THE DRAWINGS

Various embodiments of this disclosure that are proposed as examples will be described in detail with reference to the following figures, wherein like numerals reference like elements, and wherein:

FIGS. 7A and 7B show another circuit example of a delay generator using a level restoring technique and a waveform example.

DETAILED DESCRIPTION OF EMBODIMENTS

Figure 1:
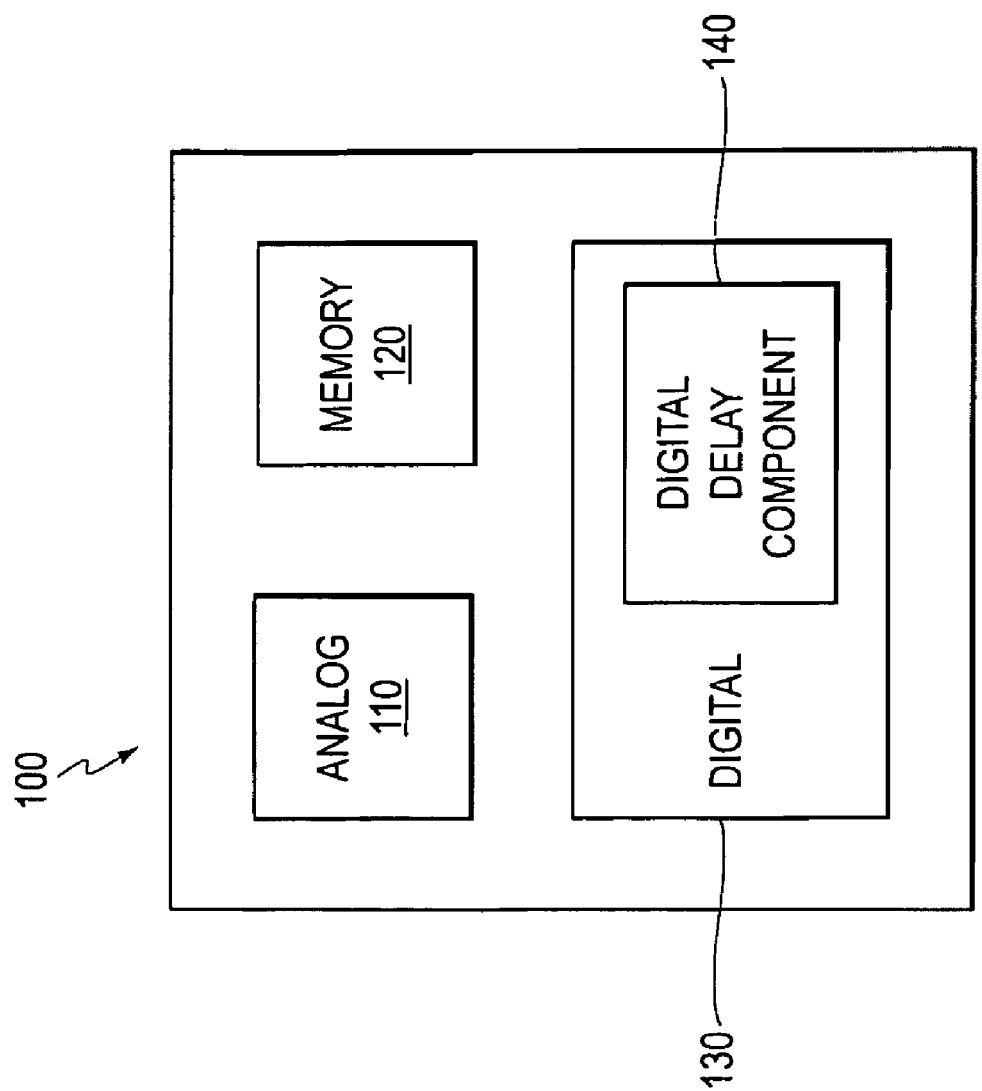
FIG. 1 shows an example of an IC chip including an improved digital delay component.

FIG. 1 shows an example of an IC chip including an improved digital delay component. The IC chip 100 may include a digital circuit 130 that can further include an improved digital delay component 140. The digital delay component 140 can be finely tuned to provide a desired delay to a signal. In addition, the digital delay component 140 can be implemented using a level restoring technique. The level restoring technique can enable the digital delay component 140 being used in a high frequency application and tunable in a wide range.

Additionally, the IC chip 100, such as an SOC, a controller, a processor, and the like, may include other circuit components, such as an analog unit 110, a memory unit 120, and the like. These elements can be coupled together to perform desired functions.

Figure 2:
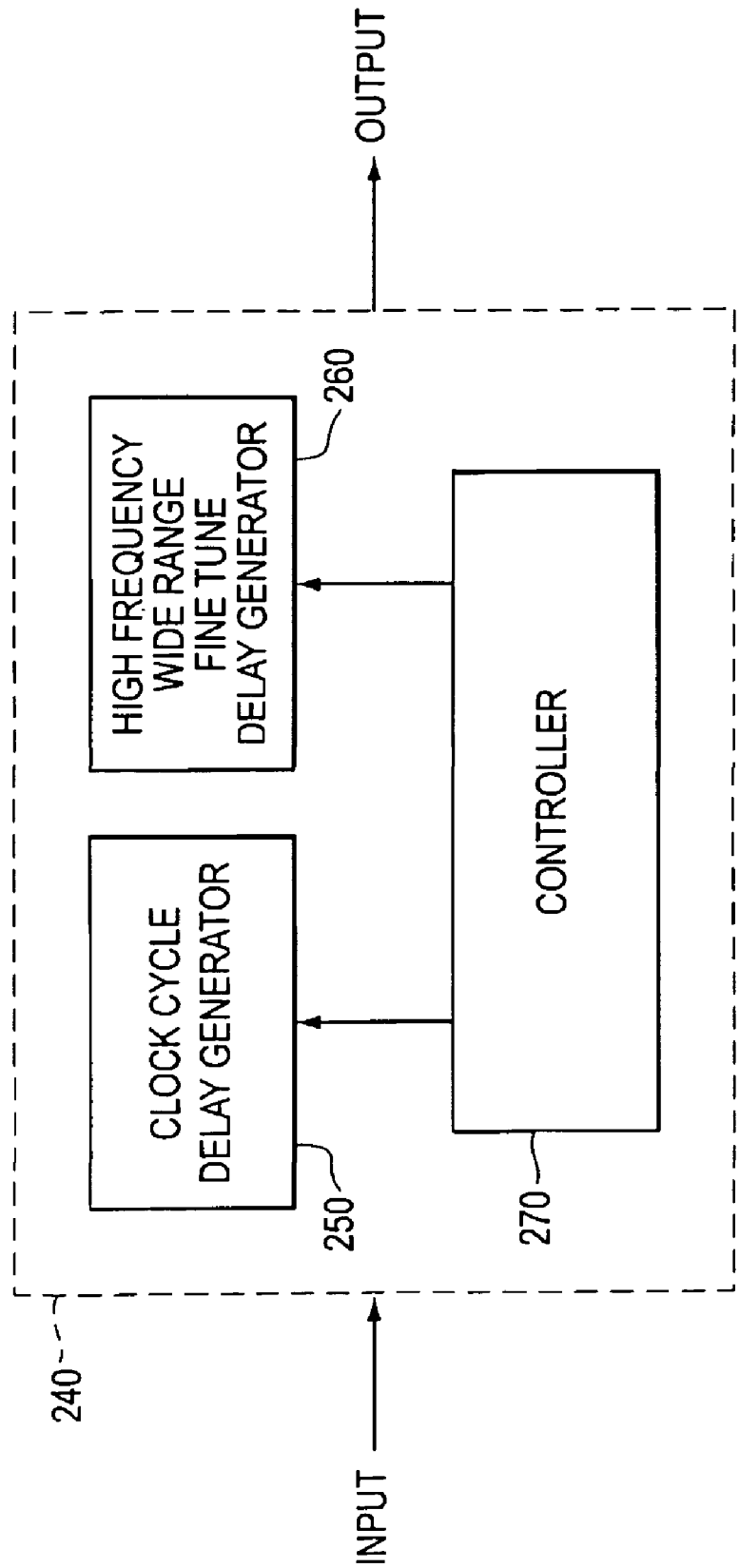
FIG. 2 shows a block diagram example of an improved digital delay component in accordance with an embodiment of the disclosure.

FIG. 2 shows a block diagram example of an improved digital delay component 240 in accordance with an embodiment of the disclosure. The digital delay component 240 may include a clock cycle delay generator 250 and a high frequency wide range fine tune delay generator 260. Optionally, the digital delay component 240 may include a controller 270. These elements can be coupled together as shown in FIG. 2. The digital delay component 240 can receive an input signal and provide an output signal that has a specific delay corresponding to the input signal.

The clock cycle delay generator 250 may delay the input signal with an integer number of clock cycles. Further, the high frequency wide range fine tune delay generator 260 can additionally delay the input signal, for example with a time smaller than a clock cycle.

In an embodiment, configurations of the clock cycle delay generator 250 and the high frequency wide range fine tune delay generator 260 can be determined prior to manufacturing, for example during design. Therefore, the clock cycle delay generator 250 and the high frequency wide range fine tune delay generator 260 can be configured by design, for example by configuring transistor sizes and transistor numbers, and can be manufactured accordingly. In another embodiment, configurations of the clock cycle delay generator 250 and the high frequency wide range fine tune delay generator 260 can be determined during the manufacturing, for example based on an in-manufacturing testing. Therefore, the clock cycle delay generator 250 and the high frequency wide range fine tune delay generator 260 can be configured by rest manufacturing process, for example using a different mask. In another embodiment, configurations of the clock cycle delay generator 250 and the high frequency wide range fine tune delay generator 260 may be determined after manufacturing, for example during system implementation. In such embodiment, the controller 270 can be optionally included to configure the clock cycle delay generator 250 and the high frequency wide range fine tune delay generator 260 to proper states in order to generate a specific delay.

It also should be noted that when a desired delay is smaller than a clock cycle, the clock cycle delay generator 250 may be absent from the digital delay component 240.

Additionally, it should be noted that the controller 270 can be coupled to multiple improved digital delay components to configure the multiple improved digital delay components, for example in order to enable a timing sequence of multiple signals.

Figure 3:
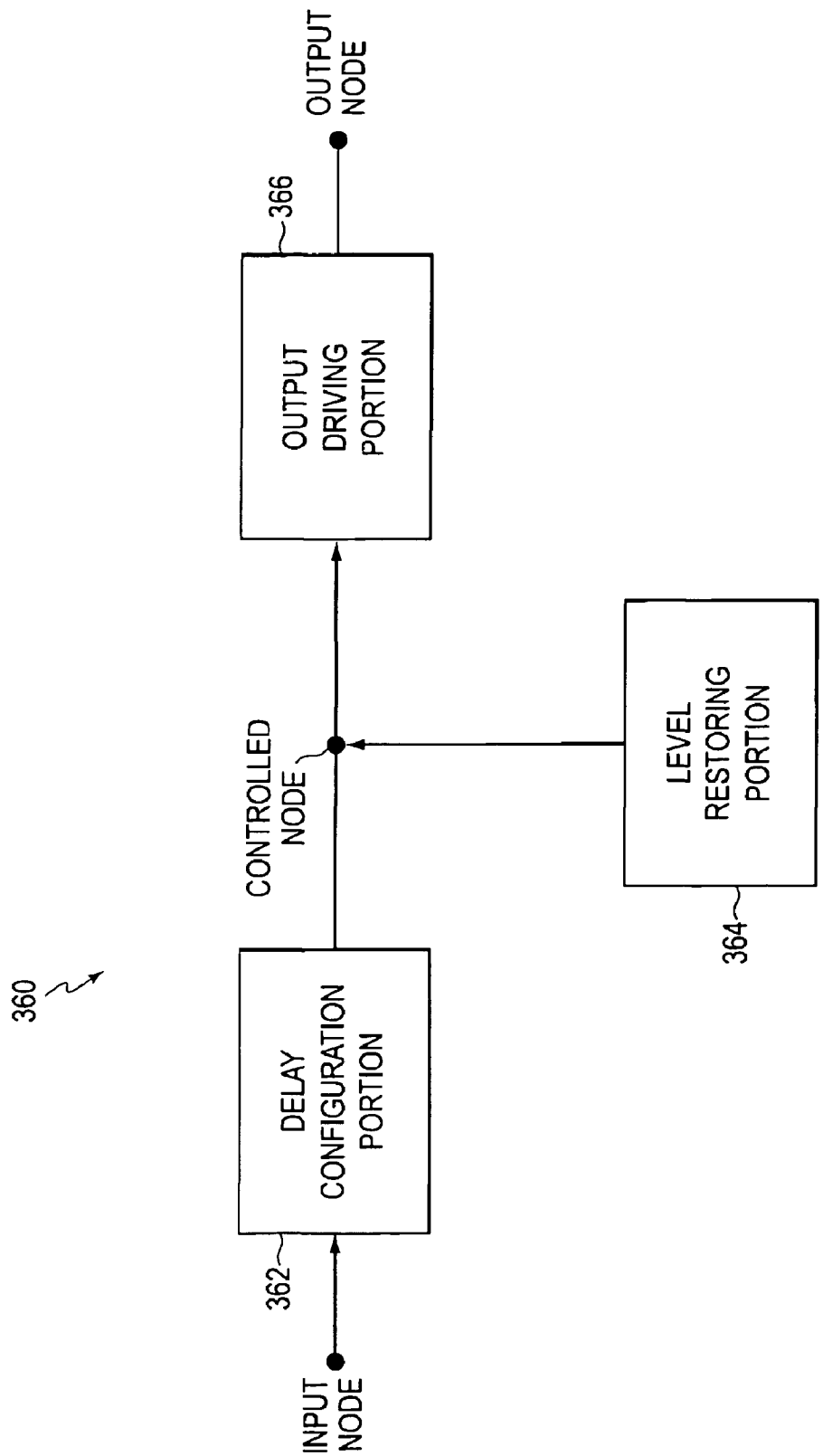
FIG. 3 shows a block diagram example of a high frequency wide range fine tune delay generator in accordance with an embodiment of the disclosure.

FIG. 3 shows a block diagram example of a high frequency wide range fine tune delay generator 360 in accordance with an embodiment of the disclosure. The high frequency wide range fine tune delay generator 360 may include a delay configuration portion 362, an output driving portion 366, and a level restoring portion 364. These components can be coupled together as shown in FIG. 3.

The delay configuration portion 362 can provide a configurable delay between an input node and a controlled node. Therefore, a signal transition of the input node, such as a rise transition or a fall transition, can result in a signal transition of the controlled node with the configurable delay.

The output driving portion 366 can provide an output signal at an output node. The output signal can have a desired transition characteristic, for example sharp transition, corresponding to the signal transition at the controlled node. For example, a signal at the controlled node may have a shallow slope transition due to a large delay. Generally, a sharp transition can be desired for circuit operations due to benefits, such as precise timing, power saving, and the like. The output driving portion 366 can generate the output signal with a sharp transition corresponding to the shallow slope transition at the controlled node.

The level restoring portion 364 can be coupled to the controlled node to restore a voltage at the controlled node, for example to a full swing level, after resulting in a transition of the output node. Generally, a transition of the output node can be initiated when a voltage of the controlled node reaches a transition level, such as an intermediate voltage between the power supply and the ground. For example, when the voltage of the controlled node is larger than the transition level, the output node can have a voltage of substantially ground level; when the voltage of the controlled node is smaller than the transition level, the output node can have a voltage of substantially power supply level. After reaching the transition level, the controlled node voltage may continue varying towards a full swing level, such as the power supply level or the ground level. However, due to, for example large delay configurations or high frequency input, the controlled node voltage may not be able to reach the full swing level before a next transition of the input node, and thus distort circuit timings. In order to enable high frequency applications and a wide tunable range, the level restoring portion 364 can restore the voltage of the controlled node to the full swing level after the voltage of the controlled node reaches a transition level.

During operation, the high frequency wide range fine tune delay generator 360 may receive an input transition at the input node. The input transition may initiate a controlled transition at the controlled node. The controlled transition may have a specific delay corresponding to the input transition by suitably configuring the delay configuration portion 362. After the controlled transition reaches a transition level, which can initiate an output transition of the output node, the level restoring portion 364 can be actuated, for example by a delay technique or a feedback technique, to restore the controlled node to a full swing level, so as to be ready for a next transition. Further, in accordance with the controlled transition, the driving portion 366 may provide the output transition at the output node with a desired transition characteristic, for example a sharp transition.

Figure 4:
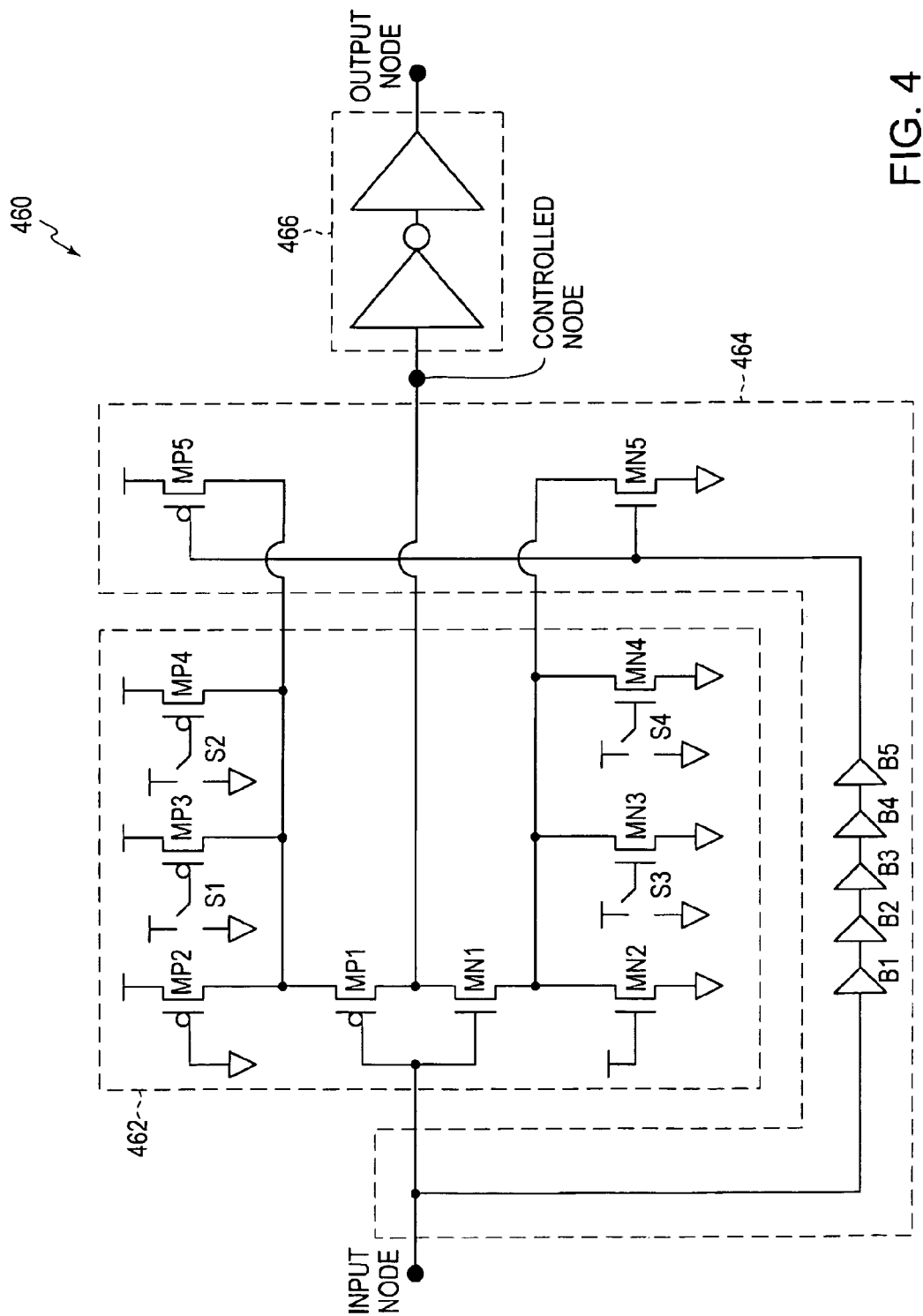
FIG. 4 shows a circuit example of a high frequency wide range fine tune delay generator in accordance with an embodiment of the disclosure.

FIG. 4 shows a circuit example 460 of a high frequency wide range fine tune delay generator in accordance with an embodiment. The high frequency wide range fine tune delay generator 460 may include a delay configuration circuit portion 462 coupled between an input node and a controlled node, an output driving circuit portion 466 coupled between the controlled node and an output node, and a level restoring circuit portion 464 coupled to the controlled node as shown in FIG. 4.

The delay configuration element 462 can include a delay element, such as an inverter, a buffer, and the like, having configurable pull-up and pull-down strengths. For the ease of description, an inverter is used for presenting the disclosure. However, the circuit example can be suitably adjusted to use other suitable delay elements. The inverter can couple the input node of the high frequency wide range fine tune delay generator 460 to the controlled node. In the example, the inverter can include a transistor pair, such as a PMOS transistor MP1 and an NMOS transistor MN1, coupled as shown in FIG. 4. Further, a group of transistors, for example PMOS transistors MP2-MP4, can provide a configurable pull-up strength for the inverter. Similarly, a group of transistors, for example NMOS transistors MN2-MP4, can provide a configurable pull-down strength for the inverter. Accordingly, a rise delay of the inverter can depend on the configurable pull-up strength, and a fall delay of the inverter can depend on the configurable pull-down strength. For example, when the group of PMOS transistors MP2-MP4 are configured to provide a large pull-up strength to the inverter, the rise delay of the inverter can be small. Similarly, when the group of NMOS transistors MN2-MN4 are configured to provide a large pull-down strength to the inverter, the fall delay of the inverter can be small, for example. In an embodiment, the pull-up strength and the pull-down strength can be configured to be substantially the same to achieve matching rise and fall time. In another embodiment, the pull-up strength and the pull-down strength can be configured to be different.

The group of PMOS transistors MP2-MP4 can be configured to provide a suitable pull-up strength by controlling a group of switches. In the example as shown in FIG. 4, MP2 is configured in a turn-on state that can provide pull-up current for the inverter. Additionally, MP3 and MP4 can be configured in either turn-on or turn-off state by controlling switches S1 and S2, respectively. Therefore, the transistors MP3 and MP4 can be individually controlled to provide additional pull-up current to obtain the suitable pull-up strength for the inverter.

Similarly, the group of NMOS transistors MN2-MN4 can be configured to provide a suitable pull-down strength by controlling a group of switches. In the example as shown in FIG. 4, MN2 is configured in a turn-on state to provide pull-down current for the inverter. Additionally, MN3 and MN4 can be configured in either turn-on state or turn-off state by controlling switches S3 and S4, respectively. Therefore, the transistors MN3 and MN4 can be individually controlled to provide additional pull-down current to obtain the suitable pull-down strength for the inverter.

As noted, the strength of the pull-up current can be configured, for example, by determining a number of PMOS transistors MP2-MP4 that contribute to the pull up current, the strength of the pull down current can be configured, for example, by determining a number of NMOS transistors MN2-MN4 that contribute to the pull down current.

The output driving circuit portion 466 can be configured to generate output transitions with desired properties. For example, sharp transitions can be desired to provide benefits, such as precise timing, power saving, and the like. However, signals at the controlled node can have shallow transitions due to large delays. In the example, the output driving circuit portion 466 may include an inverter and a buffer with large width/length ratios. Therefore, the output driving circuit portion 466 can output a sharp transition at the output node corresponding to a slow transition at the controlled node.

The level restoring circuit portion 464 can be coupled to the controlled node. The level restoring circuit portion 464 can be configured to restore a full swing voltage level of the controlled node after the controlled node reaches a transition level. For example, the level restoring circuit portion 464 may include a PMOS transistor MP5 that can be configured to provide additional pull-up strength for the inverter after the controlled node reaches a rise transition level. In addition, the level restoring circuit portion 464 may include an NMOS transistor MN5 that can be configured to provide additional pull-down strength for the inverter after the controlled node reaches a fall transition level.

In a technique to control the MP5 and MN5, which is shown in FIG. 4, gates of the MP5 and MN5 can be coupled to the input node via a delay path, for example via a series of buffers B1-B5. The delay path can be configured to be longer than a longest delay of the inverter, which can ensure the MP5 or MN5 being actuated after the controlled node reaches a transition level. It should be noted that other suitable techniques can be applied to restore the controlled node to a full swing level.

Figure 5:
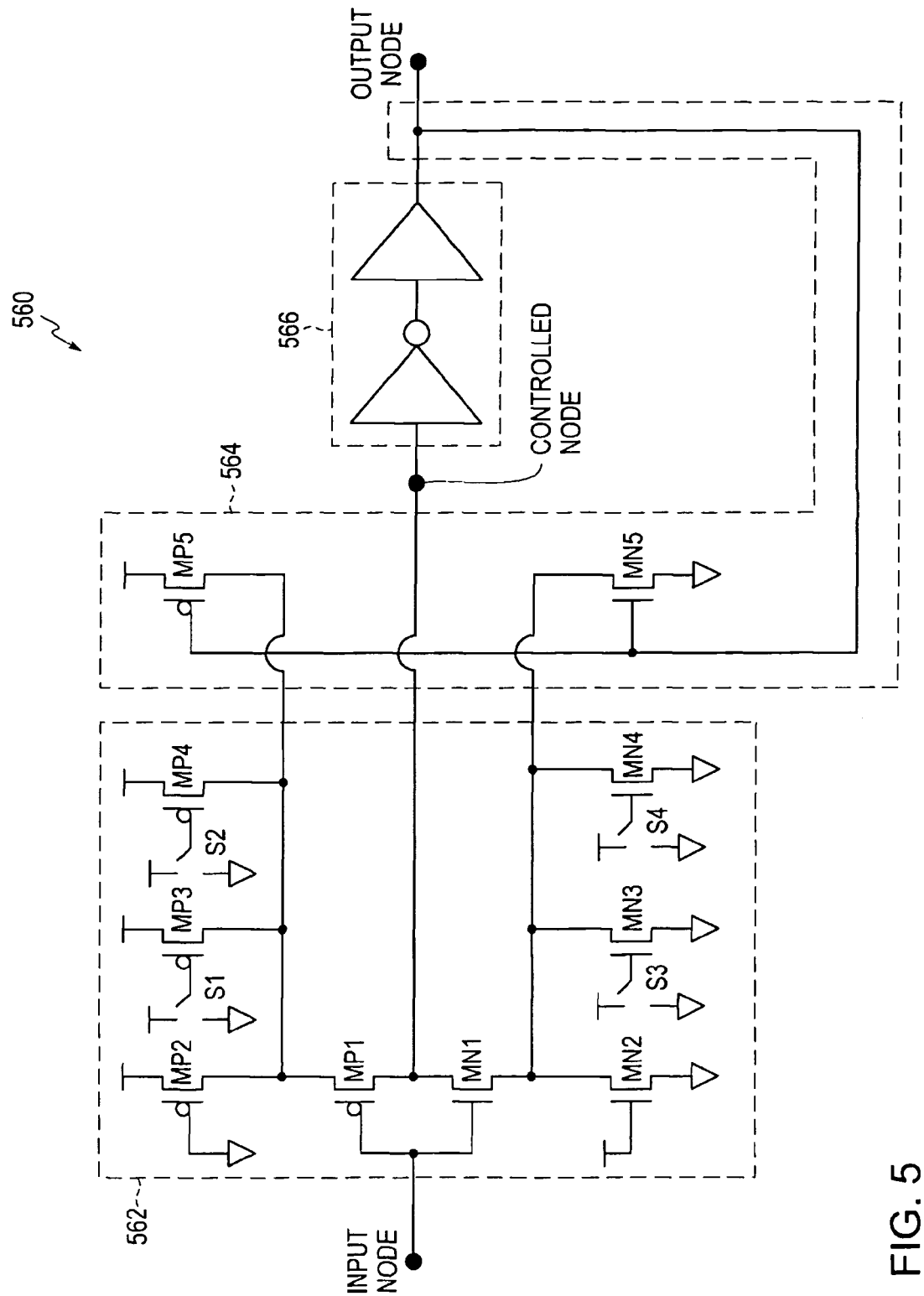
FIG. 5 shows another circuit example of a high frequency wide range fine tune delay generator in accordance with an embodiment of the disclosure.

FIG. 5 shows another circuit example 560 of a high frequency wide range fine tune delay generator. The high frequency wide range fine tune delay generator 560 can apply another technique to restore the controlled node to a full swing level.

Similar to the example shown in FIG. 4, the high frequency wide range fine tune delay generator 560 may include a delay configuration circuit portion 562, an output driving circuit portion 566 and a level restoring circuit portion 564 coupled together as shown in FIG. 5. The delay configuration circuit portion 562 and the output driving circuit portion 566 can be configured in a similar manner as the circuit example in FIG. 4.

Similar to the level restoring circuit portion 464 in FIG. 4, the level restoring circuit portion 564 can also include a PMOS transistor MP5 and an NMOS transistor MN5. The PMOS transistor MP5 can be configured to provide additional pull-up strength for restoring the controlled node to, for example the supply voltage level. The NMOS transistor MN5 can be configured to provide additional pull-down strength for restoring the controlled node to, for example the ground level.

In the example showing in FIG. 5, gates of the MP5 and MN5, which can control the states of the MP5 and MN5, can be coupled to the output node of the output driving circuit portion 566. Therefore, the additional current providers MP5 or MN5 can be actuated when an output transition at the output node has been initiated by a controlled transition at the controlled node, and feed back to the gates of the MP5 and MN5. For example, when the controlled node reaches a rise transition level due to a rise transition at the controlled node, the output driving circuit portion 566 can output a sharp fall transition correspondingly. Further, the sharp fall transition of the output node can feed back to the MP5 and actuate the MP5 to provide additional pull-up strength, which can accelerate the controlled node to rise to a full swing level.

On the other hand, when the controlled node reaches a fall transition level due to a fall transition at the controlled node, the output driving circuit portion 566 can output a sharp rise transition corresponding to the fall transition of the controlled node. Further, the sharp rise transition of the output node can feed back to the MN5, and actuate the MN5 to provide additional pull-down strength, which can accelerate the controlled node to fall to a full swing level.

As can be seen from the above examples, the level restoring circuit portions can ensure the controlled node to restore to a full swing level to prepare for a next transition after a current transition, and thus avoid distortion of timing. Therefore, the above circuit examples can be used in high frequency applications. In addition, the above circuit examples can have a wide tunable delay range.

Figure 6A:
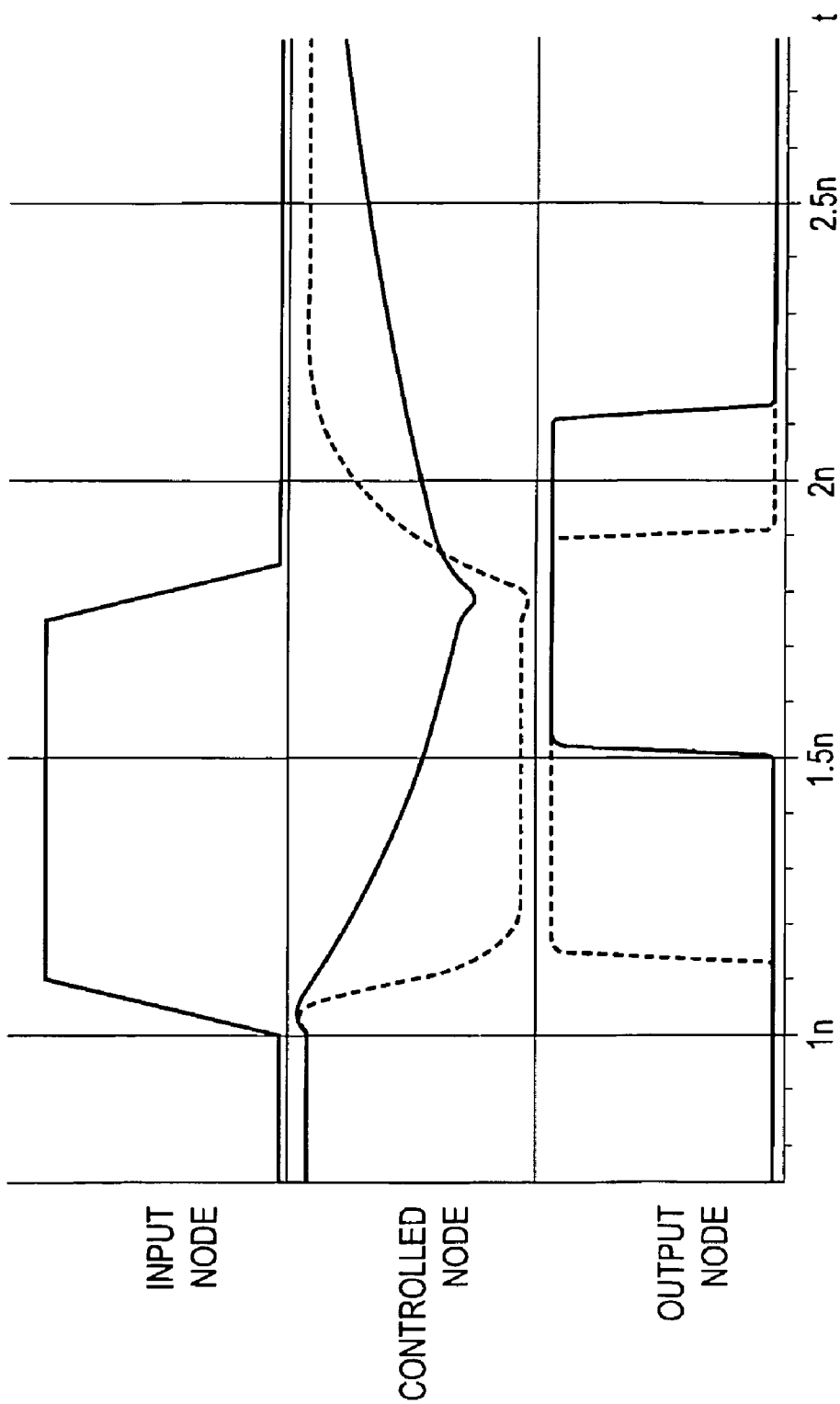
FIGS. 6A and 6B show an example of waveform improvement by using a level restoring technique.
Figure 6B:
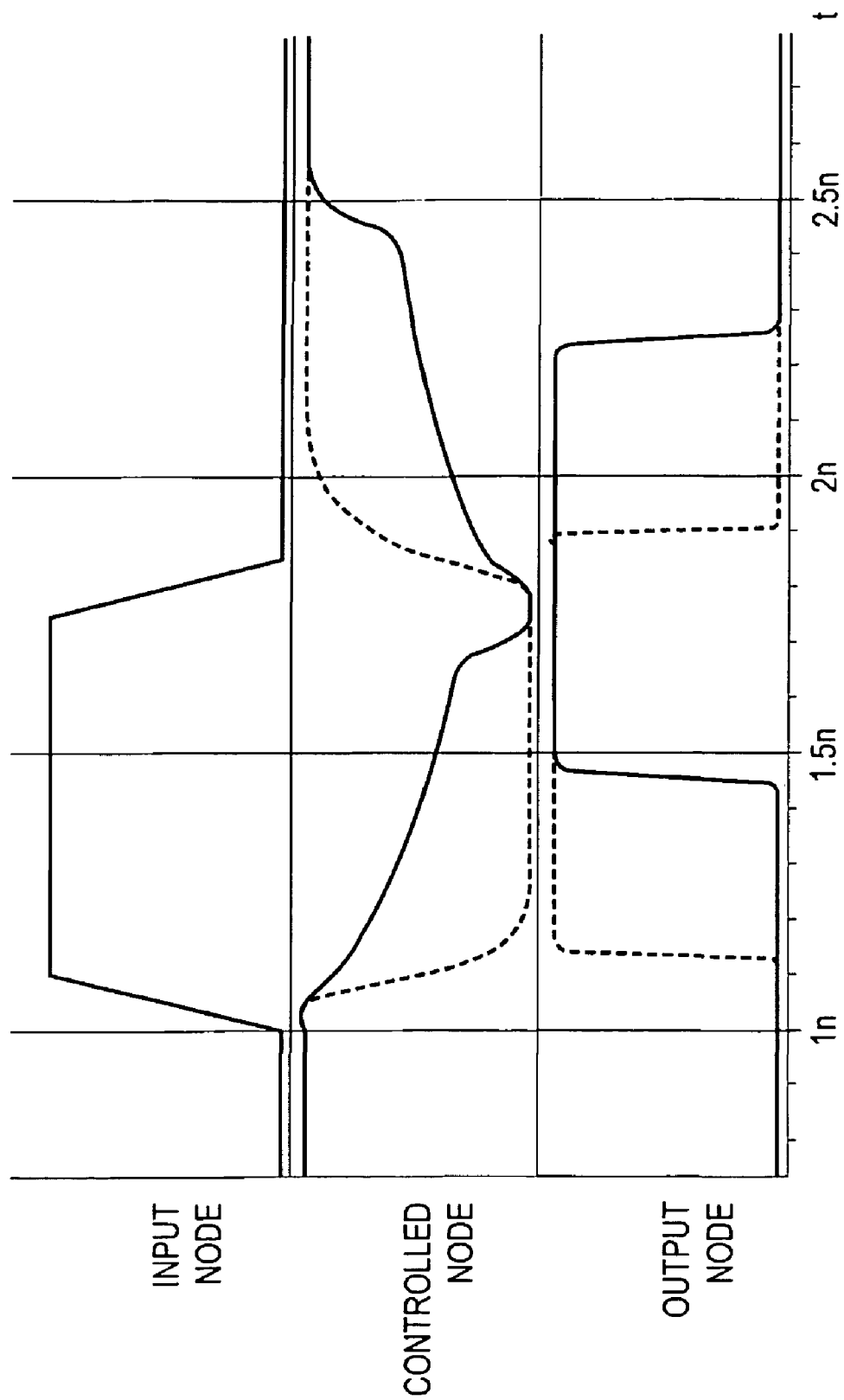

FIGS. 6A and 6B show waveforms of a circuit in accordance with an embodiment that improves timing by using a level restoring technique. FIG. 6A shows waveforms of a delay component without using a level restoring technique, while FIG. 6B shows waveforms of the delay component using a level restoring technique. In both cases, at the input node, the delay component can receive an input node waveform having a rise transition and a fall transition. Accordingly, the controlled node can generate a controlled node waveform, and the output node can generate an output node waveform. The delay component can be configured, for example in a small delay configuration and a large delay configuration. Depending on the delay configurations, waveforms at the controlled node and the output node can be different. Waveforms of the small delay configuration can be shown by dash line waveforms, and waveforms of the large delay configuration can be shown by solid line waveforms in FIGS. 6A and 6B.

As shown in FIG. 6A, when the delay component is configured in the small delay configuration, the controlled node can reach a full swing before the input node initiates a next transition. For example, the input signal can have a first transition, which is a rise transition, at 1 ns, and a second transition, which is a fall transition, at 1.75 ns as shown in FIG. 6A. Due to the first transition, the controlled node can substantially reach the ground level at about 1.2 ns, before the second transition of the input node. Therefore, the controlled node can start the second transition from its full swing level, which is the ground level in the example.

However, when the delay component is configured in the large delay configuration, the controlled node may not be able to reach the full swing before the input node initiates the second transition. In the example shown in FIG. 6A, the solid line, which represents the large delay configuration, can not reach the ground level before the second transition, as shown around 1.8 ns. Subsequently, the controlled node may start the second transition, which is a rise transition, from a voltage level that is higher than the ground level. Thus, the controlled node may reach the rise transition level in an early time, and result in the output node having an early transition corresponding to the second transition of the input node, which can distort circuit timing. In an example, when the signal at the input node is a clock signal, a duty cycle of the clock signal can be modified by the delay component, which can result in circuit malfunction.

FIG. 6B shows the waveforms of the delay component using a level restoring technique. The level restoring technique can prevent the timing distortion. As shown in FIG. 6B, when the delay component is configured in the large delay configuration, the controlled node may initially respond to the first transition at the input node in a same manner as in FIG. 6A. The controlled node may have a slow first transition from a full swing level to a transition level, as shown from 1.1 ns to 1.6 ns. Therefore, the delay configuration may maintain in a similar manner as without using the level restoring technique. However, after the controlled node reaches the transition level, which can initiate the transition at the output node, the level restoring technique can be actuated, as shown around 1.7 ns. The level restoring technique can accelerate the first transition to assist the controlled node to reach the full swing level in a short time, for example by providing additional pull-up or pull down strength. Therefore, the controlled node can start the second transition from the full swing level, and thus avoid timing distortions.

Comparing FIGS. 6A and 6B, the level restoring technique can be actuated to restore the controlled node after the controlled node reaches a transition level, thus the level restoring technique may have little impact on an inserted delay. In addition, the level restoring technique can enable the delay component to operate in high frequency applications without timing distortion. Further, the level restoring technique can enable the delay component to operate in large delay configuration without timing distortion.

It should be noted that while the above examples use configurable driving strength in the delay configuration portion, other suitable configurable delay techniques can be used to implement the high frequency wide range fine tune delay generator.

Figure 7A:
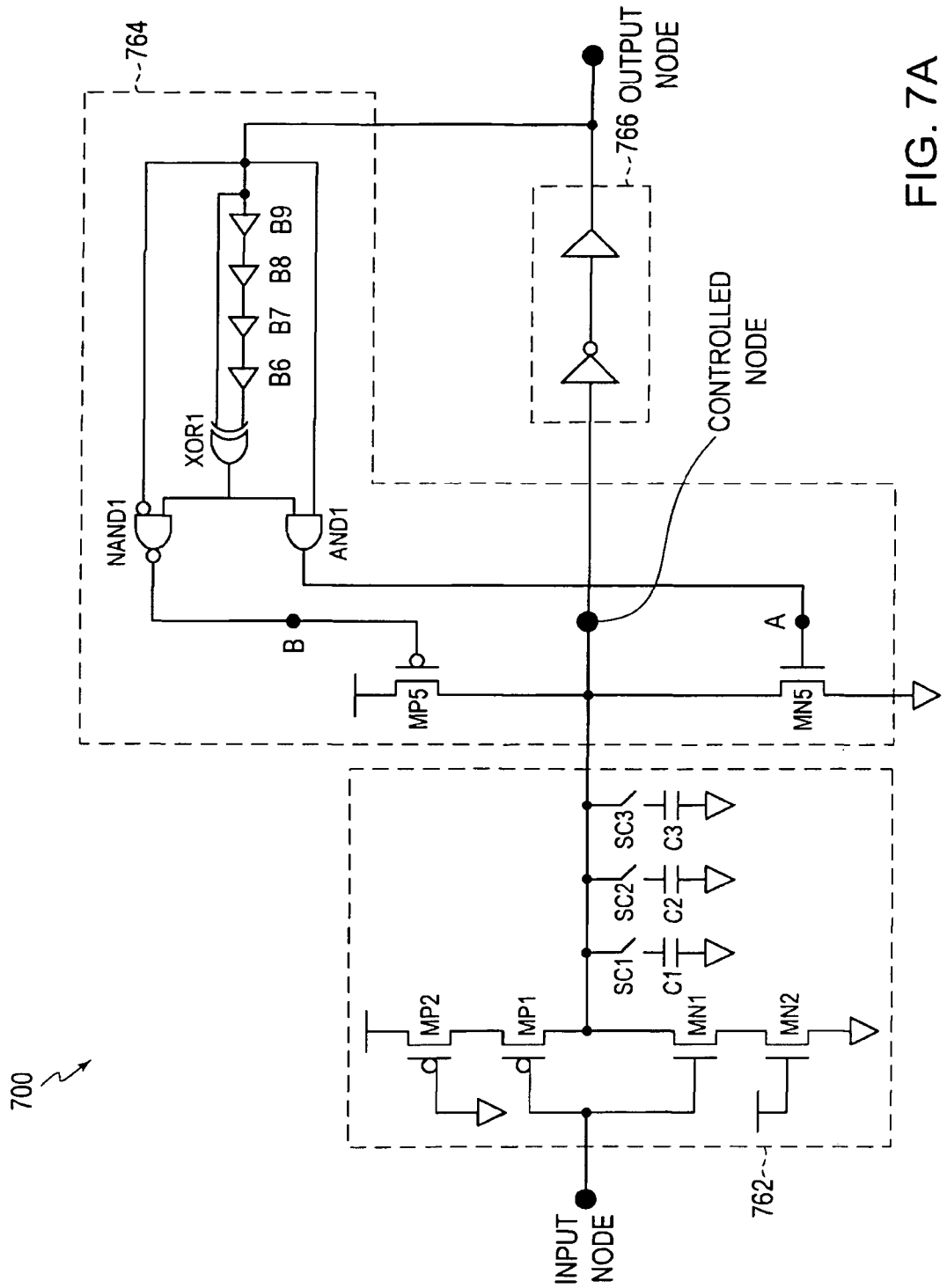

FIGS. 7A and 7B show another circuit example 700 of a high frequency wide range fine tune delay generator and a waveform example. Similarly, the high frequency wide range fine tune delay generator 700 can include a delay configuration portion 762 coupled between an input node and a controlled node, an output driving portion 766 coupled between the controlled node and an output node, and a level restoring portion 764 coupled to the controlled node.

In the example, the delay configuration portion 762 can include an inverter driving a configurable capacitance load. The inverter may include a transistor pair, such as a PMOS transistor MP1 and an NMOS transistor MN1. Further, the delay configuration portion 762 may include a current providing portion, such as a PMOS transistor MP2 to provide a pull-up strength, and an NMOS transistor MN2 to provide a pull-down strength in the example.

The configurable capacitance load can include multiple capacitances controlled by multiple switches, such as capacitances C1-C3 controlled by switches SC1-SC3 in the example. Therefore, a capacitance load at the controlled node can be configured by selectively turning on the switches SC1-SC3.

The level restoring portion 764 can be coupled to the controlled node to restore the control node to a full swing level after the controlled node reach a transition level. The level restoring portion 764 can be implemented in a similar manner as the circuit examples in FIG. 4 and in FIG. 5 with suitable adjustments. For example, as shown in FIG. 7A, the level restoring portion 764 can include a PMOS transistor MP5 that can be configured to provide additional pull-up strength, and an NMOS transistor MN5 that can be configured to provide additional pull-down strength. Additionally, the level restoring portion 764 may include circuit logics that can control the MP5 and MN5, such as a logic circuit including NAND1, AND1, XOR1 and a plurality of buffers represented by B6-B9. The logic circuit can generate control signals A and B based on an output signal at the output node to control the MP5 and MN5. Specifically, the logic circuit can provide a one-shot signal that can activate either the MP5 or MN5 for a specific time, and de-activate the MP5 or MN5 afterwards.

FIG. 7B shows a waveform example according to the circuit example of FIG. 7A. The waveform example includes example waveforms of an input signal, an output signal, and two control signals A and B. The output signal can have a specific delay corresponding to the input signal. The control signals A and B can be generated based on the output signal. Therefore, a transition of the output signal can generate a pulse in either the control signal A or the control signal B. The pulse can be used to activate either MP5 or MN5 for a pulse width time.

Figure 8:
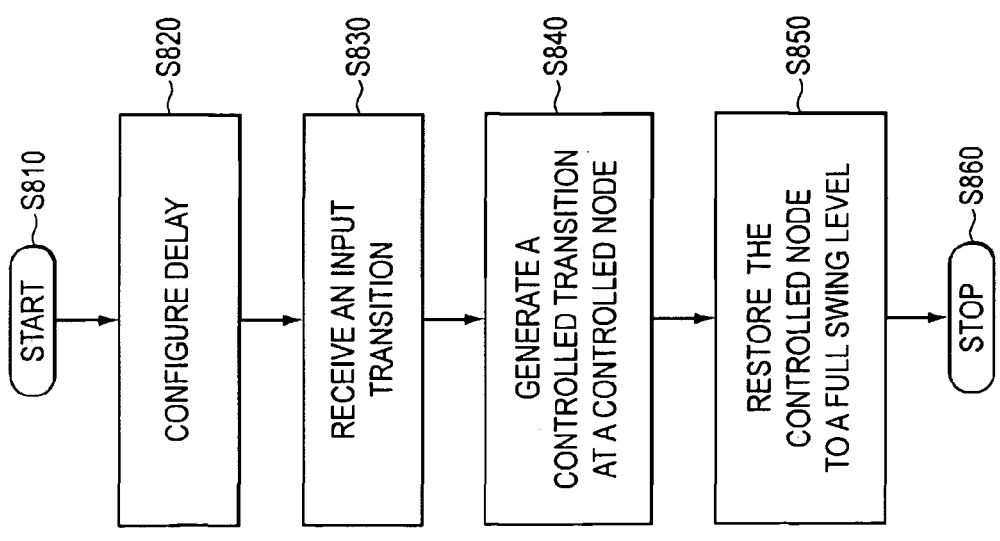
FIG. 8 shows a flowchart outlining an example of delay generating process.

FIG. 8 shows a flowchart outlining an example of a delay generation process. The process starts at step S810, and proceeds to step S820. In step S820, a delay component can be configured to provide a specific delay. For example, a controller may control status of a plurality of switches to configure the delay component. In an embodiment, the plurality of switches may control a charging or discharging current to a controlled node. In another embodiment, the plurality of switches may control a capacitance load of a controlled node. The process then proceeds to step S830.

In step S830, an input node of the delay component, such as a high frequency wide range fine tune delay generator, may receive an input signal having an input transition. The process then proceeds to step S840.

In step S840, the received input transition can result in a controlled transition at a controlled node of the delay component. The controlled transition can have a specific delay to the input transition according to a delay configuration of the delay component. Then the process proceeds to step S850.

In step S850, a restoring circuit can be actuated after the controlled node reaches a transition level. The restoring circuit can restore the controlled node to a full swing level to prepare for a next transition. In an embodiment, the restoring circuit can be actuated via a delay path from the input node. The delay path can be configured to actuate the restoring circuit after the controlled node reaches the transition level. In another embodiment, the restoring circuit can be actuated via a feedback path from an output node of an output driving circuit. The output driving circuit can be configured to output a transition having a desired property, such as a sharp transition, when the controlled node reaches the transition level. Then, the outputted transition can actuate the restoring circuit. Therefore, the restoring circuit can be actuated after the controlled node reaches the transition level. Then the process proceeds to S860 and terminates.

It should be noted that step S820 can be skipped, for example when the delay component is configured by design and manufacturing.

While the invention has been described in conjunction with the specific embodiments thereof that are proposed as examples, it is evident that many alternatives, modifications, and variations will be apparent to those skilled in the art. Accordingly, embodiments of the invention as set forth herein are intended to be illustrative, not limiting. There are changes that may be made without departing from the spirit and scope of the invention.

What is claimed is:

1. A delay circuit, comprising:
    a delay element configured to receive an input signal at an input node and output a controlled signal having a controlled rise time and a controlled fall time at a controlled node;
    a first plurality of transistors configured to bias a supply node of the delay element to govern the controlled rise time of the controlled signal;
    a second plurality of transistors configured to bias a ground node of the delay element to govern the controlled fall time of the controlled signal;
    a restoring circuit configured to charge or discharge the controlled node; and
    an output circuit that is coupled between the controlled node and an output node, the output circuit configured to generate an output signal corresponding to the controlled signal; and
    a feedback path that is coupled between the output node and the restoring circuit to actuate the restoring circuit after a transition of the output node.

2. The delay circuit according to claim 1, wherein the first plurality of transistors are p-type transistors.

3. The delay circuit according to claim 1, wherein the second plurality of transistors are n-type transistors.

4. The delay circuit according to claim 1, wherein the first plurality of transistors are configured to have a substantially same driving strength as the second plurality of transistors.

5. The delay circuit according to claim 4, wherein a pull-up strength of the first plurality of transistors is substantially same as a pull-down strength of the second plurality of transistors.

6. The delay circuit according to claim 1, wherein the first plurality of transistors are configured to have a different driving strength from the second plurality of transistors.

7. The delay circuit according to claim 6, wherein a pull-up strength of the first plurality of transistors is different from a pull-down strength of the second plurality of transistors.

8. The delay circuit according to claim 1, further comprising:
    a delay path that is coupled between the input node and the restoring circuit, the delay path causing the restoring circuit to receive a delayed input signal to actuate the restoring circuit after a delay of the input signal.

9. The delay circuit according to claim 1, further comprising:
    a clock cycle delay circuit configured to provide a delay of an integer number of clock cycles.

10. The delay circuit according to claim 1, wherein the delay element further comprises an inverter configured to invert the controlled signal relative to the input signal.

11. The delay circuit according to claim 1, wherein the first plurality of transistors comprise a configurable number of transistors to govern the controlled rise time of the controlled signal.

12. The delay circuit according to claim 1, wherein the second plurality of transistors comprise a configurable number of transistors to govern the controlled fall time of the controlled signal.

13. A delay circuit, comprising:
    a delay configuration unit coupled between an input node and a controlled node, the delay configuration unit being configured to generate a controlled transition at the controlled node corresponding to an input transition at the input node by charging or discharging the controlled node to a transition level; and
    a restoring unit coupled to the controlled node, the restoring unit being configured to accelerate charging or discharging the controlled node after the controlled node reaches the transition level.

14. The delay circuit according to claim 13, wherein the delay configuration unit further comprises a configurable driving source.

15. The delay circuit according to claim 14, wherein the configurable driving source further comprises a configurable pull-up driving source and a configurable pull-down driving source.

16. The delay circuit according to claim 15, wherein the configurable pull-up driving source further comprises a configurable number of transistors to provide a configurable pull-up strength.

17. The delay circuit according to claim 15, wherein the configurable pull-down driving source further comprises a configurable number of transistors to provide a configurable pull-down strength.

18. The delay circuit according to claim 13, wherein the restoring unit further comprises a delay path from the input node to receive a delayed input transition to actuate the restoring unit.

19. The delay circuit according to claim 18, wherein the delay path comprises at least one of inverters and buffers.

20. The delay circuit according to claim 13, further comprising:
    an output unit coupled to the controlled node and an output node, the output unit being configured to generate a sharp output transition at the output node corresponding to the controlled transition at the controlled node.

21. The delay circuit according to claim 20, wherein the restoring unit further comprises a feedback path from the output node to actuate the restoring unit after the sharp output transition.

22. The delay circuit according to claim 13, further comprising:
a clock cycle delay circuit configured to provide a delay of an integer number of clock cycles.

23. A method for delay generation, comprising:
receiving an input signal having an input transition;
generating a controlled transition having a configurable delay corresponding to the input transition at a controlled node by charging or discharging the controlled node; and
accelerating charging or discharging the controlled node after the controlled node reaching the controlled transition to restore the controlled node to a full swing level.

24. The method according to claim 23, wherein generating the controlled transition having the configurable delay, further comprises:
configuring a charge or discharge strength.

25. The method according to claim 24, wherein configuring the charge or discharge strength further comprises:
configuring a pull-up strength; and
configuring a pull-down strength.

26. The method according to claim 23, wherein configuring the pull-up strength further comprises configuring a number of transistors to provide the pull-up strength; and configuring the pull-down strength further comprises configuring a number of transistors to provide the pull-down strength.

27. The method according to claim 23, wherein restoring the controlled node further comprises:
receiving a delayed input signal.

28. The method according to claim 23, further comprising:
generating an output signal having an output transition corresponding to the controlled transition.

29. The method according to claim 28, wherein restoring the controlled node further comprises:
feeding back the output signal to control restoring the controlled node.

30. The method according to claim 23, further comprising:
delaying the input signal with an integer number of clock cycles.

* * * * *